US012641750B2

(12) United States Patent (10) Patent No.: US 12,641,750 B2
Okuno et al. (45) Date of Patent: May 26, 2026

(54) COOLING UNIT

(71) Applicant: Nidec Corporation, Kyoto (JP)

(72) Inventors: Takaya Okuno, Kyoto (JP); Takahiro Imanishi, Kyoto (JP)

(73) Assignee: NIDEC CORPORATION, Kyoto (JP)

( * ) Notice: Subject to any disclaimer, the term of this patent is extended or adjusted under 35 U.S.C. 154(b) by 379 days.

(21) Appl. No.: 18/203,187

(22) Filed: May 30, 2023

(65) Prior Publication Data

US 2023/0389227 A1 Nov. 30, 2023

(30) Foreign Application Priority Data

May 31, 2022 (JP) ................................ 2022-089061

(51) Int. Cl.
*H05K 7/20* (2006.01)
(52) U.S. Cl.
CPC ............................... *H05K 7/20254* (2013.01)
(58) Field of Classification Search
CPC ... G06F 1/18; G06F 1/20; G06F 1/181; G06F 1/183; G06F 2200/201; H05K 7/20; H05K 7/20609; H05K 7/20727; H05K 7/20772; H05K 7/20254
See application file for complete search history.

(56) References Cited

U.S. PATENT DOCUMENTS

| | | | | |
|---|---|---|---|---|
| 10,721,842 | B1 * | 7/2020 | Fathi | H05K 7/20809 |
| 10,952,354 | B1 * | 3/2021 | Chen | H01L 23/46 |
| 2013/0208421 | A1 * | 8/2013 | Chester | H05K 7/20281 |
| | | | | 165/104.31 |
| 2020/0303852 | A1 * | 9/2020 | Wan | H01R 13/24 |
| 2021/0084797 | A1 * | 3/2021 | Shao | G06F 1/206 |
| 2022/0159874 | A1 * | 5/2022 | Chen | H05K 7/20254 |

FOREIGN PATENT DOCUMENTS

| | | |
|---|---|---|
| CN | 207780708 U | 8/2018 |
| CN | 109358709 A | 2/2019 |

OTHER PUBLICATIONS

CN109358709A mt (Year: 2019).*

* cited by examiner

*Primary Examiner* — Gordon A Jones
(74) *Attorney, Agent, or Firm* — Keating & Bennett, LLP

(57) ABSTRACT

A cooling assembly includes a first heat exchanger and a first flow path pipe. The first heat exchanger comes into contact with a first heat generating component. The first flow path pipe is connected to the first heat exchanger. The first flow path pipe includes a first intermediate portion between one end of the first flow path pipe connected to the first heat exchanger and the other end of the first flow path pipe. The first heat exchanger includes a first fixing portion that fixes the first intermediate portion of the first flow path pipe. The first heat exchanger includes a metal cold plate in contact with the first heat generating component, and a synthetic resin cover on one side in a first direction with respect to the cold plate.

9 Claims, 7 Drawing Sheets

COOLING UNIT

CROSS-REFERENCE TO RELATED APPLICATIONS

The present application claims priority under 35 U.S.C. § 119 to Japanese Patent Application No. 2022-089061, filed on May 31, 2022, the entire contents of which are hereby incorporated herein by reference.

1. FIELD OF THE INVENTION

The present disclosure relates to a cooling assembly.

2. BACKGROUND

A cooling structure includes a support plate, a plurality of cooling plates, and a refrigerant pipe having flexibility. The plurality of cooling plates are internally provided with a refrigerant flow path. The refrigerant pipe connects refrigerant flow paths of adjacent cooling plates. Individual integrated circuits are independently pressed and cooled by individual cooling plates.

In the conventional cooling structure, when the cooling assembly is installed on the integrated circuit and when the cooling structure installed on the integrated circuit is replaced with a new cooling structure, the refrigerant pipe is sometimes caught by the integrated circuit or the like. Therefore, the cooling structure, the integrated circuit, and the like may be damaged.

SUMMARY

A cooling assembly according to an example embodiment of the present disclosure includes a first heat exchanger and a first flow path pipe. The first heat exchanger comes into contact with a first heat generating component. The first flow path pipe is connected to the first heat exchanger. The first flow path pipe includes a first intermediate portion positioned between one end of the first flow path pipe connected to the first heat exchanger and another end of the first flow path pipe. The first heat exchanger includes a first fixing portion that fixes the first intermediate portion of the first flow path pipe.

The above and other elements, features, steps, characteristics and advantages of the present disclosure will become more apparent from the following detailed description of the example embodiments with reference to the attached drawings.

DETAILED DESCRIPTION

Hereinafter, example embodiments of the present disclosure will be described with reference to the drawings. The present description appropriately describes a first direction Z, a second direction X, and a third direction Y orthogonal to one another for easy understanding. Here, a direction from the cold plate toward a cover is referred to as "first direction Z". A direction orthogonal to the first direction Z is referred to as "second direction X". A direction orthogonal to the first direction Z and the second direction X is referred to as "third direction Y".

A direction on one side in the first direction Z is referred to as "one side (+Z direction) in the first direction", and a direction on the other side is referred to as "other side (−Z direction) in the first direction". A direction on one side in the second direction X is referred to as "one side (+X direction) in the second direction", and a direction on the other side is referred to as "other side (−X direction) in the second direction". A direction on one side in the third direction Y is referred to as "one side (+Y direction) in the third direction", and a direction on the other side is referred to as "other side (−Y direction) in the third direction".

In the present application, for convenience, the first direction Z may be described as an up-down direction. For example, the one side (+Z direction) in the first direction Z indicates the upward direction, and the other side (−Z direction) in the first direction Z indicates the downward direction. However, the up-down direction, an upward direction, and a downward direction are defined for convenience of description, and do not need to coincide with the vertical direction. The up-down direction is merely defined for convenience of description, and the orientation of the cooling assembly according to the present disclosure at the time of use is not limited. In the present description, "orthogonal direction" does not represent orthogonal in a strict sense, and includes, for example, a case of being orthogonal to a degree to which the effects of the present disclosure are achieved.

Figure 1:
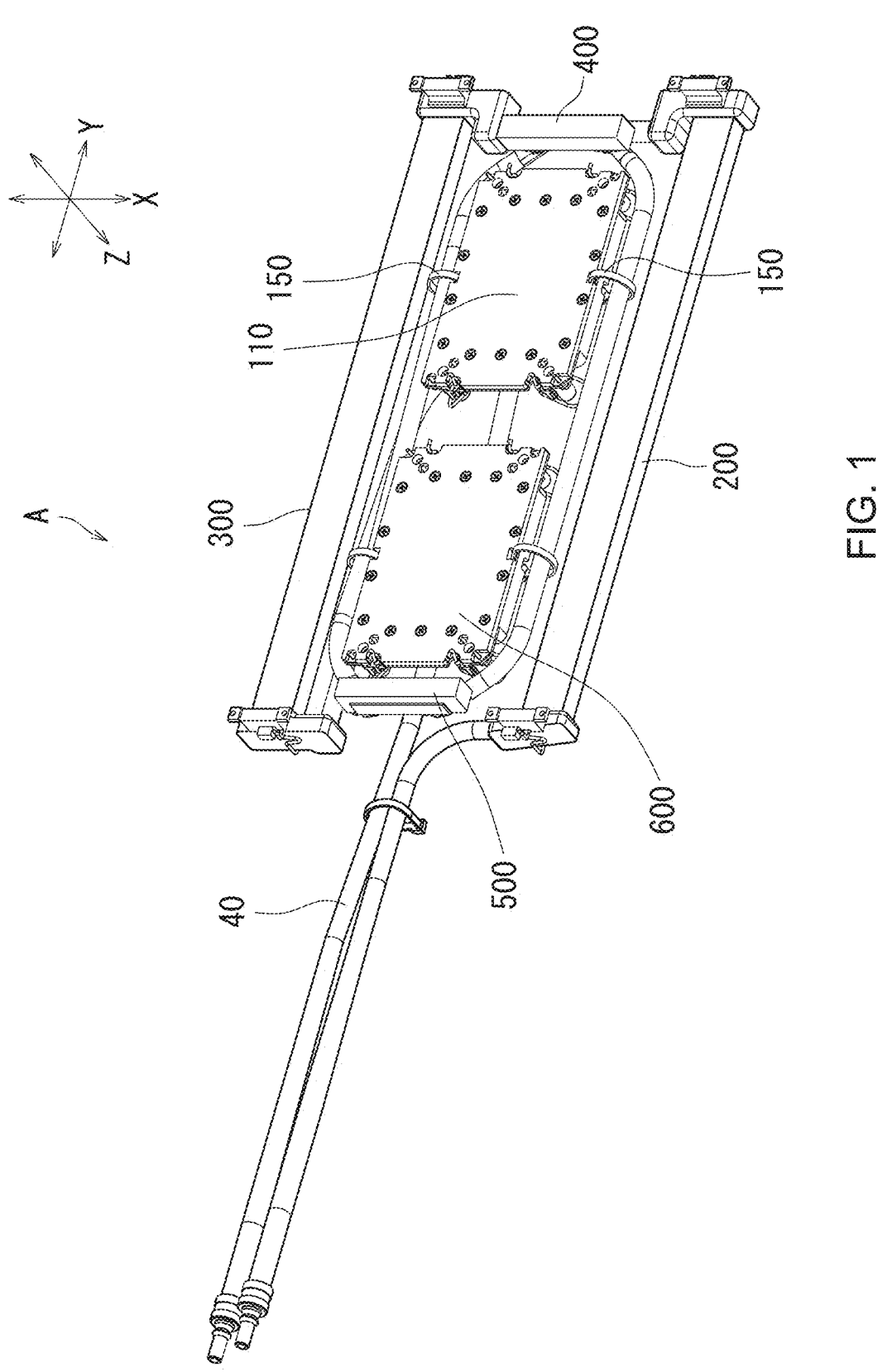
FIG. 1 is an overall perspective view of a cooling assembly of a first example embodiment of the present disclosure.
Figure 2:
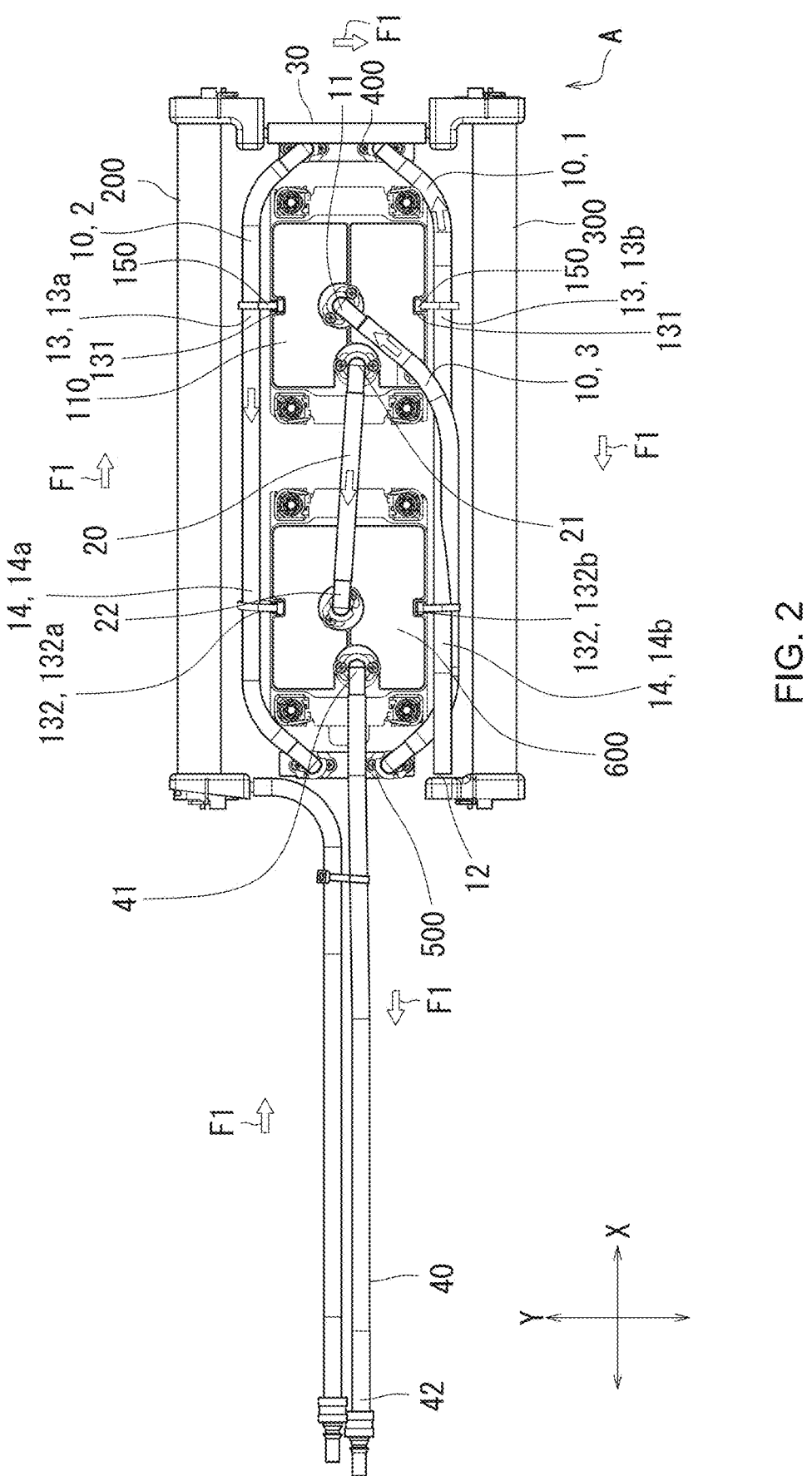
FIG. 2 is an overall plan view of the cooling assembly of the first example embodiment.

A cooling assembly A of the first example embodiment of the present disclosure will be described. FIG. 1 is an overall perspective view of the cooling assembly A of the first example embodiment. FIG. 2 is an overall plan view of the cooling assembly A of the first example embodiment. As shown in FIGS. 1 and 2, the cooling assembly A includes a first heat exchanger 110, a first flow path pipe 10, and a second flow path pipe 20.

A coolant flows from the first flow path pipe 10 through the first heat exchanger 110 to the second flow path pipe 20 by a pump (not shown). The coolant is an example of "refrigerant". The pump is connected to, for example, the first flow path pipe 10 or the second flow path pipe 20. In the first example embodiment, the coolant is liquid. As the coolant, for example, an antifreeze liquid such as an ethylene glycol aqueous solution or a propylene glycol aqueous solution, pure water, or the like is used.

The first heat exchanger 110 comes into contact with the first heat generating component. Specifically, the first heat exchanger 110 comes into contact with the first heat generating component, which is a heat source, and absorbs heat from the first heat generating component. The coolant having absorbed heat in the first heat exchanger 110 flows through the second flow path pipe 20. Examples of the exemplary first heat generating component include a microprocessor used in a computer.

The first flow path pipe 10 is connected to the first heat exchanger 110. The first flow path pipe 10 is a pipe-shaped component made of synthetic resin. The first flow path pipe 10 includes one end 11, the other end 12, and a first intermediate portion 13. The first intermediate portion 13 is positioned between the one end 11 and the other end 12. The one end 11 of the first flow path pipe 10 is connected to the first heat exchanger 110.

The first heat exchanger 110 includes a first fixing portion 131. The first fixing portion 131 fixes the first intermediate portion 13 of the first flow path pipe 10. In the first example embodiment, the first heat exchanger 110 includes two first fixing portions 131. The two first fixing portions 131 fix two first intermediate portions 13 different from each other.

The second flow path pipe 20 is connected to the first heat exchanger 110. The second flow path pipe 20 is a pipe-shaped component made of synthetic resin. The second flow path pipe 20 includes one end 21 and the other end 22. The one end 21 of the second flow path pipe 20 is connected to the first heat exchanger 110.

As a result, the coolant flows along F1 of FIG. 2. Specifically, the coolant flows through the first flow path pipe to the first heat exchanger 110. When flowing through the first heat exchanger 110, the coolant absorbs heat from the first heat generating component. The coolant having absorbed heat flows to the second flow path pipe 20.

As described above with reference to FIGS. 1 and 2, in the first example embodiment, the first fixing portion 131 fixes the first intermediate portion 13 of the first flow path pipe 10. As a result, it is possible to suppress the first flow path pipe from separating from the first heat exchanger 110. Therefore, when installing the cooling assembly A on the first heat generating component and when replacing the cooling assembly A installed on the first heat generating component with a new cooling assembly A, it is possible to suppress the first flow path pipe 10 from being caught by other members such as the first heat generating component. As a result, it is possible to suppress the cooling assembly A, the first heat generating component, and the like from being damaged.

Figure 3:
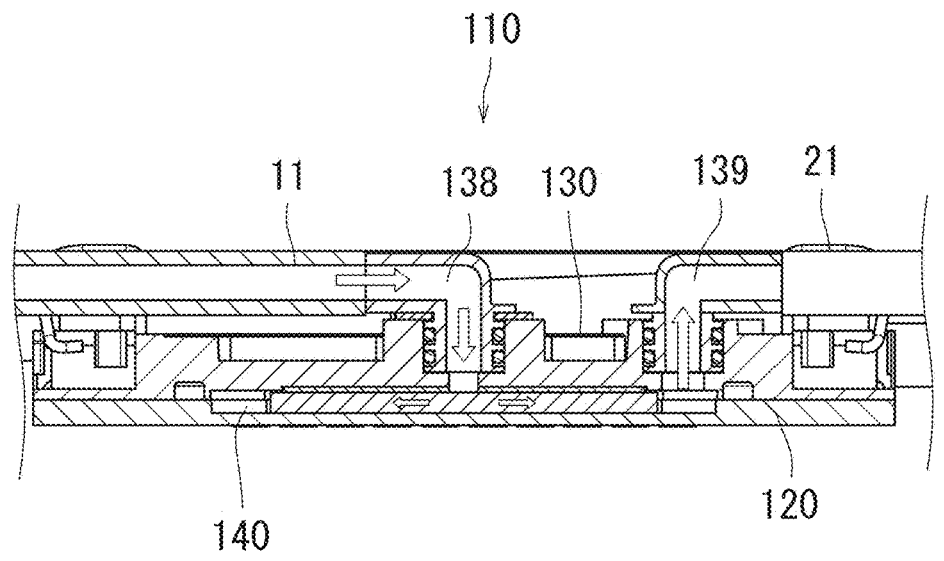
FIG. 3 is a sectional view of the first heat exchanger according to the first example embodiment taken along a first direction and a second direction.

Subsequently, the structure of the first heat exchanger 110 will be described with reference to FIGS. 1 to 3. FIG. 3 is a sectional view of the first heat exchanger 110 according to the first example embodiment of the present disclosure taken along the first direction Z and the third direction Y. As shown in FIG. 3, the first heat exchanger 110 includes a cold plate 120 made of metal and a cover 130 made of synthetic resin.

The cold plate 120 comes into contact with the first heat generating component. The cold plate 120 is a plate member made of copper or aluminum. The cold plate 120 absorbs heat from the first heat generating component and transfers the heat to the coolant. For example, the cold plate 120 is a plate member perpendicular to the first direction Z. The cold plate 120 is arranged on the one side in the first direction Z with respect to the first heat generating component. In other words, an upper surface of the first heat generating component comes into contact with a lower surface of the cold plate 120.

The cover 130 is arranged on the one side in the first direction Z with respect to the cold plate 120. For example, the cover 130 is a plate member perpendicular to the first direction Z. In the first direction Z, a refrigerant flow path 140 is formed between an upper surface of the cold plate 120 and a lower surface of the cover 130.

The cover 130 includes an inflow portion 138 and an outflow portion 139. The inflow portion 138 and the outflow portion 139 are arranged on the one side in the first direction Z of the cover 130. In other words, the inflow portion 138 and the outflow portion 139 are arranged on the upper surface of the cover 130. Specifically, the inflow portion 138 is arranged at a center of the upper surface of the cover 130.

The inflow portion 138 allows the coolant to flow in. The one end 11 of the first flow path pipe 10 is connected to the inflow portion 138. The inflow portion 138 is continuous to the refrigerant flow path 140. As a result, the coolant in the first flow path pipe 10 flows into the refrigerant flow path 140 from the inflow portion 138.

The outflow portion 139 allows the coolant to flow out. The one end 21 of the second flow path pipe 20 is connected to the outflow portion 139. The outflow portion 139 is continuous to the refrigerant flow path 140. As a result, the coolant in the refrigerant flow path 140 flows out from the outflow portion 139 to the second flow path pipe 20.

Figure 4:
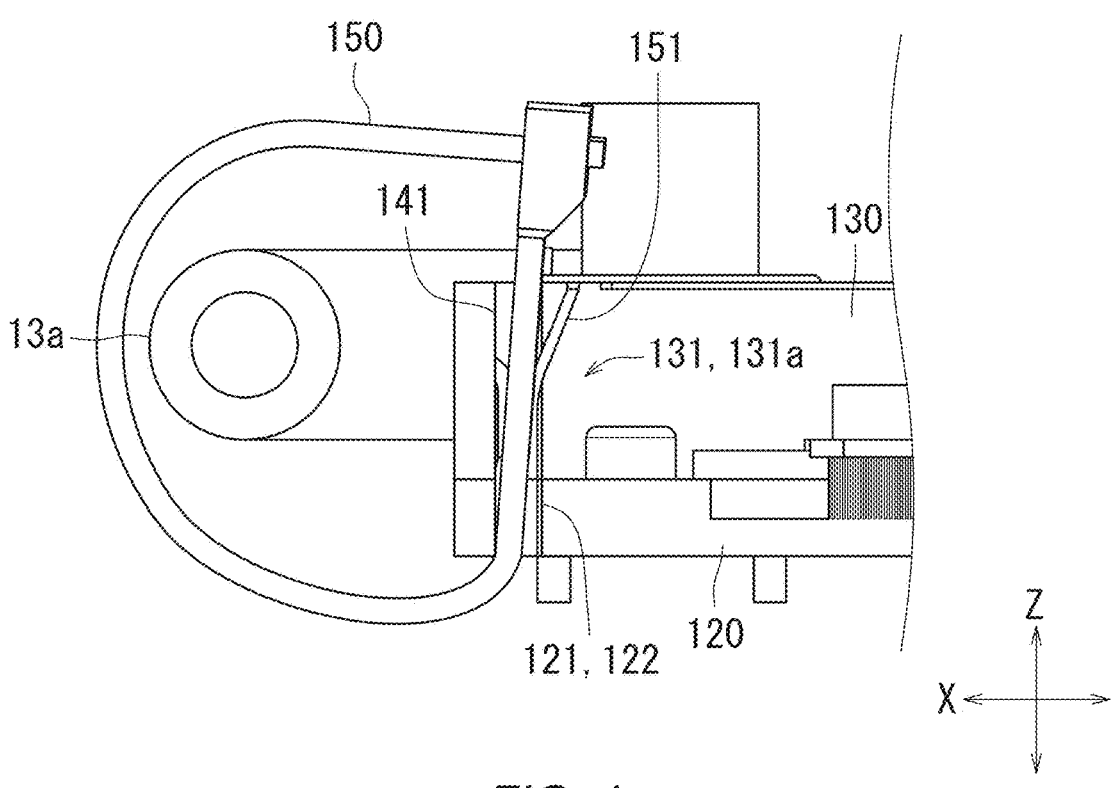
FIG. 4 is a sectional view of the first heat exchanger according to the first example embodiment taken along the first direction and a third direction.
Figure 5:
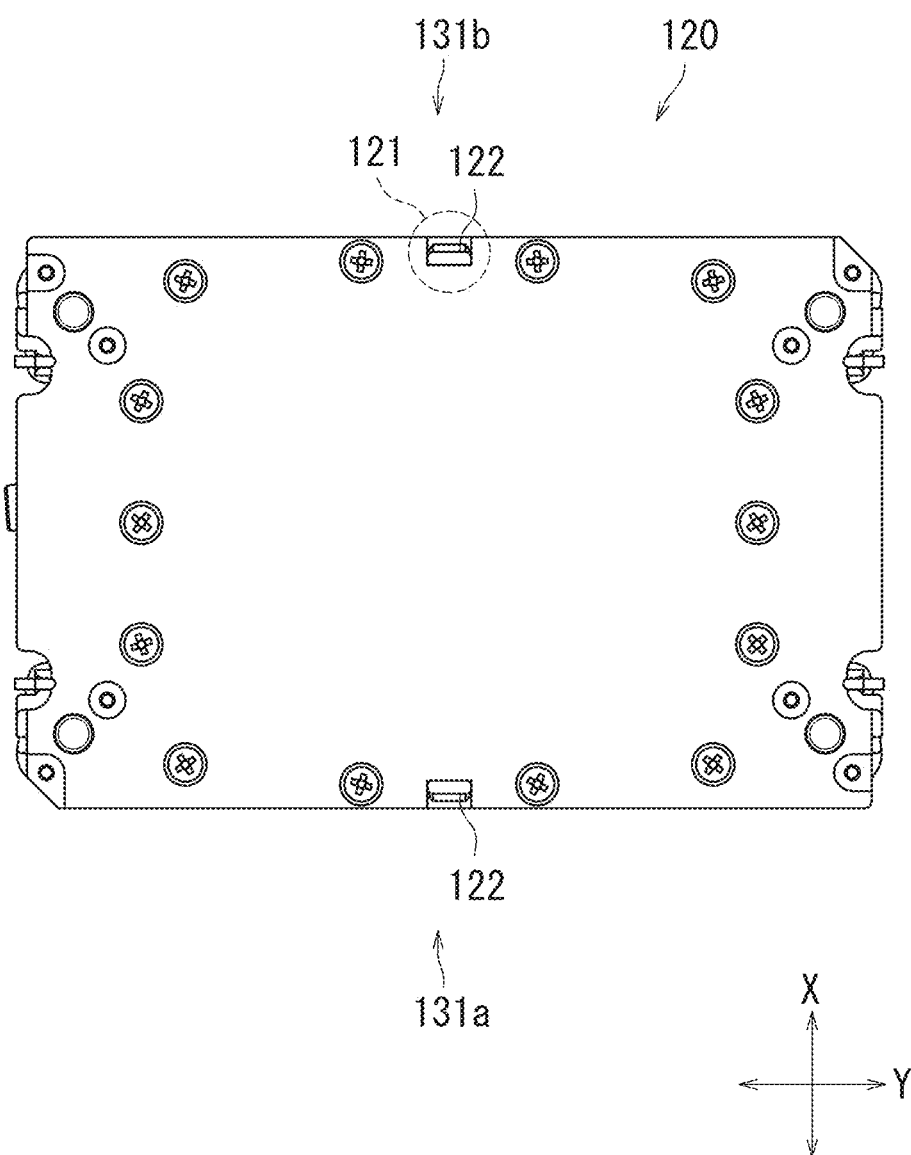
FIG. 5 is a rear view of a cold plate according to the first example embodiment.

Next, the structure of the first fixing portion 131 will be described with reference to FIGS. 4 and 5. FIG. 4 is a sectional view of the first heat exchanger 110 according to the first example embodiment of the present disclosure taken along the first direction Z and the second direction X. FIG. 5 is a rear view of the cold plate 120 according to the first example embodiment. As shown in FIGS. 4 and 5, the cover 130 includes two first fixing portions 131.

Each of the two first fixing portions 131 includes a first through-hole 141. The first through-hole 141 penetrates the cover 130 along the first direction Z.

One first fixing portion 131a of the two first fixing portions 131 is arranged on the one side in the second direction X of the cover 130. The other first fixing portion 131b of the two first fixing portions 131 is arranged on the other side in the second direction X of the cover 130.

The first fixing portion 131 further includes an inclined portion 151 arranged on the one side in the first direction Z of the first through-hole 141. The inclined portion 151 is arranged on the one side in the first direction Z of the first through-hole 141. The inclined portion 151 is inclined to the second direction X side. Specifically, the inclined portion 151 of the first fixing portion 131a is inclined to the other side in the second direction X. The inclined portion 151 of the first fixing portion 131b is inclined to the one side in the second direction X.

The cold plate 120 includes two guide portions 121. The guide portion 121 at least partially overlaps the first through-hole 141 in the first direction Z. The guide portion 121 is connected to an end on the other side in the first direction Z of the first through-hole 141. For example, the guide portion 121 includes a second through-hole 122. The second through-hole 122 penetrates the cold plate 120 along the first direction Z.

The first flow path pipe 10 includes a first pipe 1, a second pipe 2, a third pipe 3, and the two first intermediate portions 13. The first pipe 1, the second pipe 2, and the third pipe 3 are arranged in this order from upstream toward downstream of the first flow path pipe 10. The one end 11 of the first flow path pipe 10 is arranged on the downstream side of the third pipe 3. The other end 12 of the first flow path pipe 10 is arranged on the upstream side of the first pipe 1. One first intermediate portion 13b of the two first intermediate portions 13 is arranged in an intermediate portion of the first pipe 1. The other first intermediate portion 13a of the two first intermediate portions 13 is arranged in an intermediate portion of the second pipe 2.

The second pipe 2 is arranged on the one side in the second direction X of the cover 130. The first intermediate portion 13a is fixed to the first fixing portion 131a. Specifically, the first intermediate portion 13a is fixed to the first through-hole 141 using a fixing portion 150 having a substantially annular shape. The fixing portion 150 is, for example, a binding band or a C-shaped member. A part of the fixing portion 150 having the substantially annular shape is arranged in the first through-hole 141. A part of the fixing portion 150 having the substantially annular shape is arranged in the guide portion 121. The first intermediate portion 13a is arranged in an internal space formed by the fixing portion 150 having the substantially annular shape. That is, by inserting the first fixing portion 131a into the first through-hole 141 and the guide portion 121, the first intermediate portion 13a can be easily fixed.

The first pipe 1 is arranged on the other side in the second direction X of the cover 130. The first intermediate portion 13b is fixed to the first fixing portion 131b. Specifically, the first intermediate portion 13b is fixed to the first through-hole 141 using the fixing portion 150 having the substantially annular shape. A part of the fixing portion 150 having the substantially annular shape is arranged in the first through-hole 141. A part of the fixing portion 150 having the substantially annular shape is arranged in the guide portion 121. The first intermediate portion 13b is arranged in an internal space formed by the fixing portion 150 having the substantially annular shape. That is, by inserting the first fixing portion 131b into the first through-hole 141 and the guide portion 121, the first intermediate portion 13b can be easily fixed.

The third pipe 3 is arranged on the one side in the first direction Z of the cover 130. The one end 11 of the first flow path pipe 10 is connected to the inflow portion 138.

As described above with reference to FIGS. 4 and 5, in the first example embodiment, the cover 130 is made of synthetic resin. As a result, the first fixing portion 131, the inflow portion 138, and the outflow portion 139 can be easily formed in the cover 130.

The first fixing portion 131 further includes the inclined portion 151. As a result, the fixing portion 150 can be easily inserted into the first through-hole 141.

The cooling assembly A of the first example embodiment will be described with reference to FIG. 1 again. As shown in FIG. 1, the cooling assembly A further includes a second heat exchanger 200, a third heat exchanger 300, and a third flow path pipe 30.

The second heat exchanger 200 comes into contact with the second heat generating component. Specifically, the second heat exchanger 200 comes into contact with the second heat generating component, which is a heat source, and absorbs heat from the second heat generating component. Examples of the exemplary second heat generating component include a memory used in a computer.

The second heat exchanger 200 extends along the third direction Y. The second heat exchanger 200 includes a plurality of refrigerant pipes. Each of the plurality of refrigerant pipes extends along the third direction Y. The plurality of refrigerant pipes are arranged at intervals in the second direction X. Each of the plurality of refrigerant pipes is a plate-shaped component made of a metal material having excellent thermal conductivity, such as copper or aluminum.

The third heat exchanger 300 comes into contact with the third heat generating component. Specifically, the third heat exchanger 300 comes into contact with the third heat generating component, which is a heat source, and absorbs heat from the third heat generating component. Examples of the exemplary third heat generating component include a memory used in a computer.

The third heat exchanger 300 has the same configuration as that of the second heat exchanger 200 and extends along the third direction Y. The third heat exchanger 300 includes a plurality of refrigerant pipes. Each of the plurality of refrigerant pipes extends along the third direction Y. The plurality of refrigerant pipes are arranged at intervals in the second direction X. Each of the plurality of refrigerant pipes is a plate-shaped component made of a metal material having excellent thermal conductivity, such as copper or aluminum.

The first heat exchanger 110 is arranged between the second heat exchanger 200 and the third heat exchanger 300 in the second direction X. The second heat exchanger 200 and the third heat exchanger 300 are connected via the third flow path pipe 30. The third flow path pipe 30 extends along the second direction X. The third flow path pipe 30 is a pipe-shaped component made of resin. The third heat exchanger 300 is connected to the other end 12 of the first flow path pipe 10.

As a result, the coolant flows along F1 of FIG. 2. Specifically, the coolant flows to the second heat exchanger 200. When flowing through the second heat exchanger 200, the coolant absorbs heat from the second heat generating component. The coolant having absorbed heat flows to the third flow path pipe 30. The coolant flows through the third flow path pipe 30 to the third heat exchanger 300. When flowing through the third heat exchanger 300, the coolant absorbs heat from the third heat generating component. The coolant having absorbed heat flows to the first flow path pipe 10. The coolant flows through the first flow path pipe 10 to the first heat exchanger 110. When flowing through the first heat exchanger 110, the coolant absorbs heat from the first heat generating component. The coolant having absorbed heat flows to the second flow path pipe 20.

As a result, in the first example embodiment, a plurality of heat generating components can be cooled. For example, a microprocessor and a plurality of memories used in a computer can be cooled.

The cooling assembly A of the first example embodiment will be described with reference to FIGS. 1 and 2 again. As shown in FIGS. 1 and 2, the cooling assembly A further includes a fourth heat exchanger 400 and a fifth heat exchanger 500.

The fourth heat exchanger 400 comes into contact with the fourth heat generating component. Specifically, the fourth heat exchanger 400 comes into contact with the fourth heat generating component, which is a heat source, and absorbs heat from the fourth heat generating component. Examples of the exemplary fourth heat generating component include a power semiconductor used in an inverter or the like.

The fourth heat exchanger 400 extends along the second direction X. The fourth heat exchanger 400 is a pipe-shaped component made of a metal material having excellent thermal conductivity, such as copper or aluminum.

The fifth heat exchanger 500 comes into contact with the fifth heat generating component. Specifically, the fifth heat exchanger 500 comes into contact with the fifth heat generating component, which is a heat source, and absorbs heat from the fifth heat generating component. Examples of the exemplary fifth heat generating component include a power semiconductor used in an inverter or the like.

The fifth heat exchanger 500 has the same configuration as that of the fourth heat exchanger 400, and extends along the second direction X. The fifth heat exchanger 500 is a pipe-shaped component made of a metal material having excellent thermal conductivity, such as copper or aluminum.

The first heat exchanger 110 is arranged between the fourth heat exchanger 400 and the fifth heat exchanger 500 in the third direction Y.

The first pipe 1 is connected to the fourth heat exchanger 400. The second pipe 2 is arranged between the fourth heat exchanger 400 and the fifth heat exchanger 500. The third pipe 3 is arranged between the fifth heat exchanger 500 and the first heat exchanger 110.

The first pipe 1 is arranged between the first heat exchanger 110 and the third heat exchanger 300 in the second direction X. Therefore, it is possible to further suppress the first flow path pipe 10 from being caught by other members such as the first heat generating component. The second pipe 2 is arranged between the first heat exchanger 110 and the second heat exchanger 200 in the second direction X. Therefore, it is possible to further suppress the first flow path pipe 10 from being caught by other members such as the first heat generating component.

As a result, the coolant flows along F1 of FIG. 2. Specifically, the coolant flows to the second heat exchanger 200. When flowing through the second heat exchanger 200, the coolant absorbs heat from the second heat generating component. The coolant having absorbed heat flows to the third flow path pipe 30. The coolant flows through the third flow path pipe 30 to the third heat exchanger 300. When flowing through the third heat exchanger 300, the coolant absorbs heat from the third heat generating component. The coolant having absorbed heat flows to the first pipe 1 of the first flow path pipe 10.

The coolant flows through the first pipe 1 to the fourth heat exchanger 400. When flowing through the fourth heat exchanger 400, the coolant absorbs heat from the fourth heat generating component. The coolant having absorbed heat flows to the second pipe 2. The coolant flows through the second pipe 2 to the fifth heat exchanger 500. When flowing through the fifth heat exchanger 500, the coolant absorbs heat from the fifth heat generating component. The coolant having absorbed heat flows to the third pipe 3. The coolant flows through the third pipe 3 to the first heat exchanger 110. When flowing through the first heat exchanger 110, the coolant absorbs heat from the first heat generating component. The coolant having absorbed heat flows to the second flow path pipe 20.

As a result, in the first example embodiment, a plurality of heat generating components can be cooled. For example, a microprocessor and a plurality of power semiconductors used in a computer can be cooled.

The cooling assembly A of the first example embodiment will be described with reference to FIGS. 1 and 2 again. As shown in FIGS. 1 and 2, the cooling assembly A further includes a sixth heat exchanger 600 and a fourth flow path pipe 40.

The sixth heat exchanger 600 comes into contact with the sixth heat generating component. Specifically, the sixth heat exchanger 600 comes into contact with the sixth heat generating component, which is a heat source, and absorbs heat from the sixth heat generating component. The coolant having absorbed heat in the sixth heat exchanger 600 flows through the fourth flow path pipe 40. Examples of the exemplary sixth heat generating component include a microprocessor used in a computer.

The sixth heat exchanger 600 has the same configuration as that of the first heat exchanger 110, and includes the cold plate 120 made of metal and the cover 130 made of synthetic resin.

The cover 130 includes two second fixing portions 132, the inflow portion 138, and the outflow portion 139. Each of the two second fixing portions 132 includes the first through-hole 141. The first through-hole 141 penetrates the cover 130 along the first direction Z.

One second fixing portion 132a of the two second fixing portions 132 is arranged on the one side in the second direction X of the cover 130. The other second fixing portion 132b of the two second fixing portions 132 is arranged on the other side in the second direction X of the cover 130.

The first flow path pipe 10 further includes two second intermediate portions 14. One second intermediate portion 14a of the two second intermediate portions 14 is arranged in the intermediate portion of the second pipe 2. The other second intermediate portion 14b of the two second intermediate portions 14 is arranged in the intermediate portion of the first pipe 1.

The second intermediate portion 14a is fixed to the second fixing portion 132a. Specifically, the second intermediate portion 14a is fixed to the first through-hole 141 using the fixing portion 150 having the substantially annular shape. A part of the fixing portion 150 having the substantially annular shape is arranged in the first through-hole 141. The second intermediate portion 14a is arranged in an internal space formed by the fixing portion 150 having the substantially annular shape. As a result, it is possible to suppress the second pipe 2 from separating from the cover 130. Therefore, it is possible to suppress the first flow path pipe 10 from being caught by other members such as the sixth heat generating component. The second pipe 2 is arranged between the sixth heat exchanger 600 and the second heat exchanger 200 in the second direction X. Therefore, it is possible to further suppress the first flow path pipe 10 from being caught by other members such as the sixth heat generating component.

The second intermediate portion 14b is fixed to the second fixing portion 132b. Specifically, the second intermediate portion 14b is fixed to the first through-hole 141 using the fixing portion 150 having the substantially annular shape. A part of the fixing portion 150 having the substantially annular shape is arranged in the first through-hole 141. The second intermediate portion 14b is arranged in an internal space formed by the fixing portion 150 having the substantially annular shape. As a result, it is possible to suppress the first pipe 1 from separating from the cover 130. Therefore, it is possible to suppress the first flow path pipe 10 from being caught by other members such as the sixth heat generating component. The first pipe 1 is arranged between the sixth heat exchanger 600 and the third heat exchanger 300 in the second direction X. Therefore, it is possible to further suppress the first flow path pipe 10 from being caught by other members such as the sixth heat generating component.

The sixth heat exchanger 600 is positioned on the other side in the third direction Y of the first heat exchanger 110, and the first heat exchanger 110 is positioned on the one side in the third direction Y of the sixth heat exchanger 600. The other end 22 of the second flow path pipe 20 is connected to the sixth heat exchanger 600.

The fourth flow path pipe 40 is connected to the sixth heat exchanger 600. The fourth flow path pipe 40 is a pipe-shaped component made of resin. The fourth flow path pipe 40 includes one end 41 and the other end 42. The one end 41 of the fourth flow path pipe 40 is connected to the sixth heat exchanger 600.

As a result, the coolant flows along F1 of FIG. 2. Specifically, the coolant flows to the second heat exchanger 200. When flowing through the second heat exchanger 200, the coolant absorbs heat from the second heat generating component. The coolant having absorbed heat flows to the third flow path pipe 30. The coolant flows through the third flow path pipe 30 to the third heat exchanger 300. When flowing through the third heat exchanger 300, the coolant absorbs heat from the third heat generating component. The coolant having absorbed heat flows to the first pipe 1 of the first flow path pipe 10.

The coolant flows through the first pipe 1 to the fourth heat exchanger 400. When flowing through the fourth heat exchanger 400, the coolant absorbs heat from the fourth heat generating component. The coolant having absorbed heat flows to the second pipe 2. The coolant flows through the second pipe 2 to the fifth heat exchanger 500. When flowing through the fifth heat exchanger 500, the coolant absorbs heat from the fifth heat generating component. The coolant having absorbed heat flows to the third pipe 3. The coolant flows through the third pipe 3 to the first heat exchanger 110. When flowing through the first heat exchanger 110, the coolant absorbs heat from the first heat generating component. The coolant having absorbed heat flows to the second flow path pipe 20.

The coolant flows through the second flow path pipe 20 to the sixth heat exchanger 600. When flowing through the sixth heat exchanger 600, the coolant absorbs heat from the sixth heat generating component. The coolant having absorbed heat flows to the fourth flow path pipe 40.

As a result, in the first example embodiment, a plurality of heat generating components can be cooled. For example, a plurality of microprocessors can be cooled.

Figure 6:
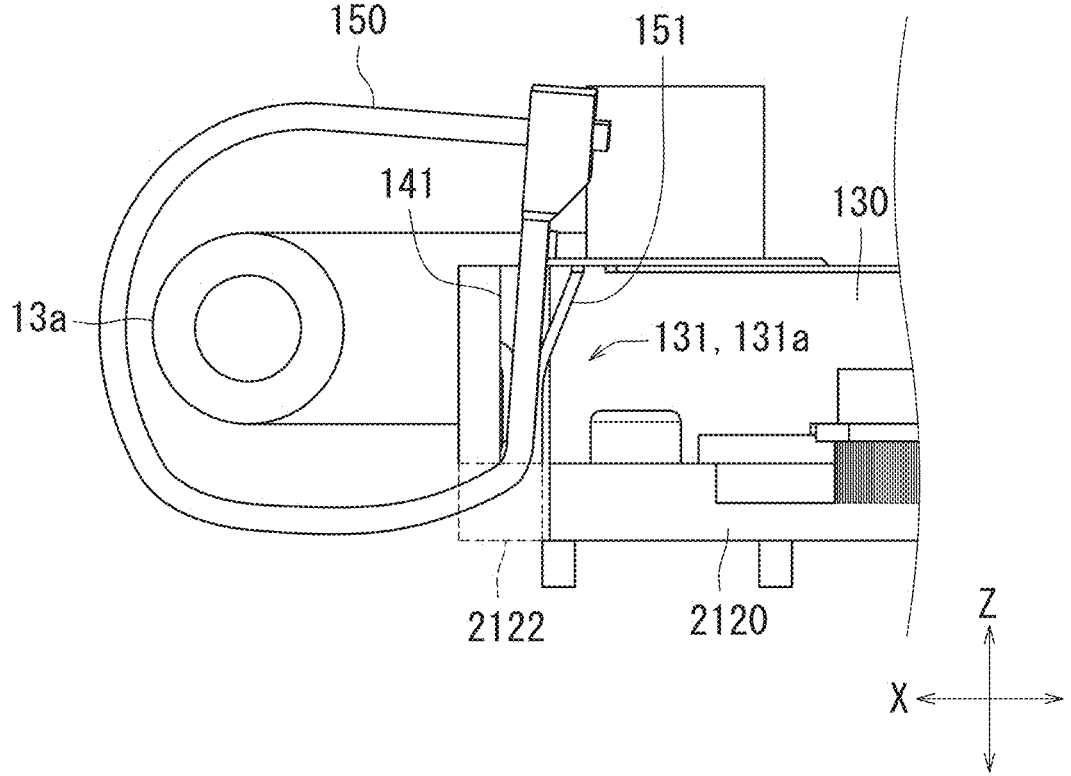
FIG. 6 is a sectional view of a first heat exchanger according to a second example embodiment of the present disclosure taken along the first direction and the third direction.
Figure 7:
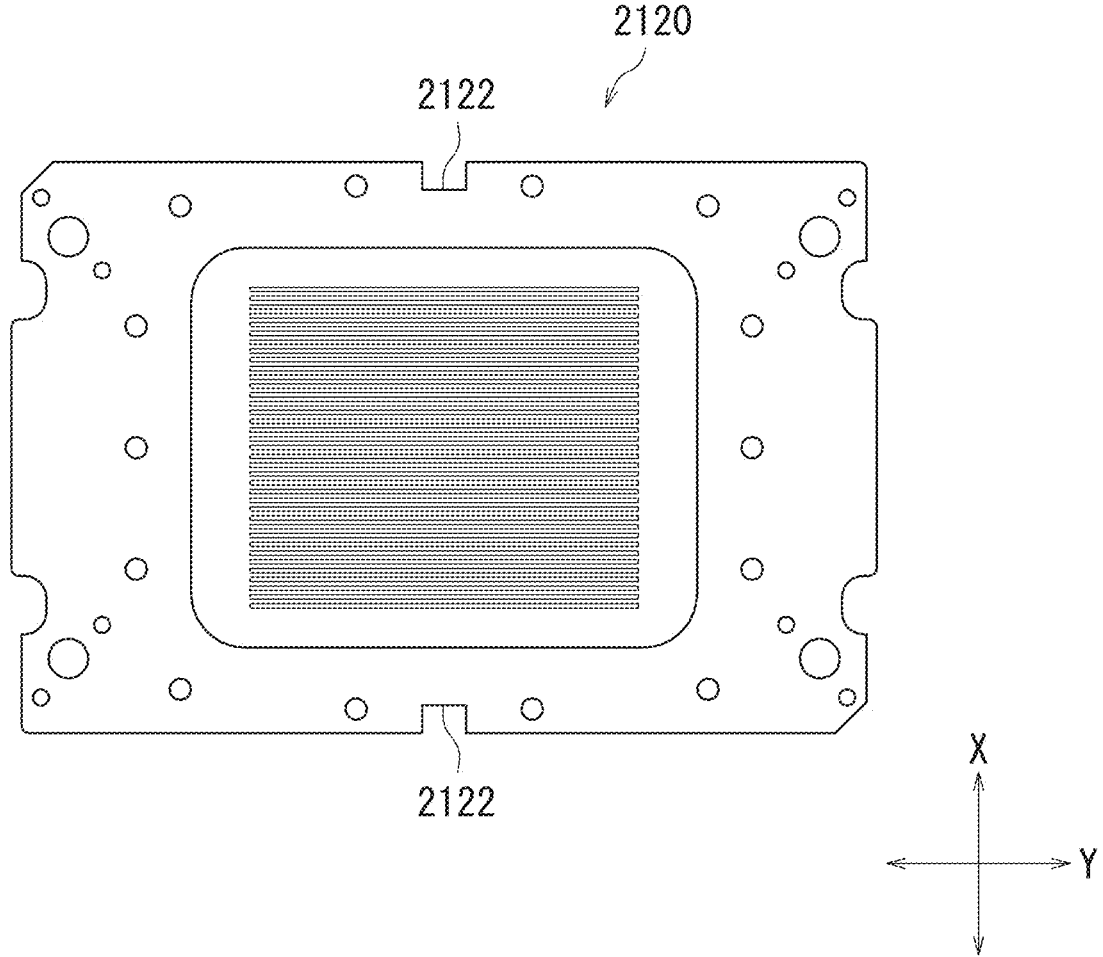
FIG. 7 is a front view of a cold plate according to the second example embodiment.

A cooling assembly A according to the second example embodiment of the present disclosure will be described with reference to FIGS. 6 and 7. FIG. 6 is a sectional view of the first heat exchanger 110 according to the second example embodiment of the present disclosure taken along the first direction Z and the second direction X. FIG. 7 is a front view of a cold plate 2120 according to the second example embodiment. The cold plate 2120 according to the second example embodiment is different from the cold plate of the first example embodiment in that the cold plate 2120 has two cutout portions 2122. Hereinafter, differences of the second example embodiment from the first example embodiment will be mainly described.

As shown in FIGS. 6 and 7, the cold plate 2120 includes the two guide portions 121. The guide portion 121 at least partially overlaps the first through-hole 141 in the first direction Z. The guide portion 121 is connected to an end on the other side in the first direction Z of the first through-hole 141. For example, the guide portion 121 includes the cutout portion 2122. The cutout portion 2122 cuts out the cold plate 2120 along the second direction X. As a result, the fixing portion 150 can be released in the second direction X, and contact between other members such as the first heat generating component and the fixing portion 150 can be suppressed.

Figure 8:
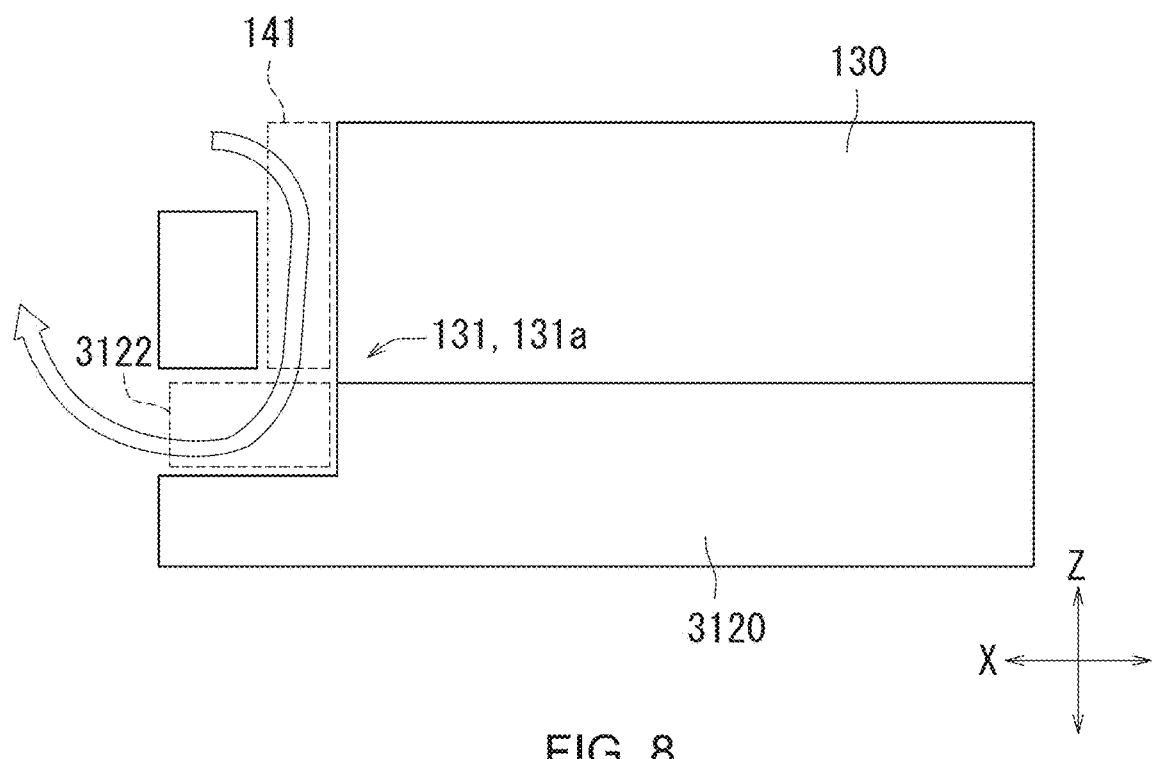
FIG. 8 is a sectional view of a first heat exchanger according to a third example embodiment of the present disclosure taken along the first direction and the third direction.

A cooling assembly A according to the third example embodiment of the present disclosure will be described with reference to FIG. 8. FIG. 8 is a sectional view of the first heat exchanger 110 according to the third example embodiment of the present disclosure taken along the first direction Z and the second direction X. A cold plate 3120 according to the third example embodiment is different from the cold plate of the first example embodiment in that the cold plate 3120 has two groove portions 3122. Hereinafter, differences of the third example embodiment from the first example embodiment will be mainly described.

As shown in FIG. 8, the cold plate 3120 includes the two guide portions 121. The guide portion 121 at least partially overlaps the first through-hole 141 in the first direction Z. The guide portion 121 is connected to an end on the other side in the first direction Z of the first through-hole 141. For example, the guide portion 121 includes the groove portion 3122 on the one side in the first direction Z of the cold plate 3120. The groove portion 3122 extends along the second direction X. As a result, the fixing portion 150 can be released in the second direction X, and contact between other members such as the first heat generating component and the fixing portion 150 can be suppressed. The center position of the fixing portion 150 can be shifted on the cold plate 3120 side, and the fixing position of the first flow path pipe 10 can be shifted on the cold plate 3120 side.

Figure 9:
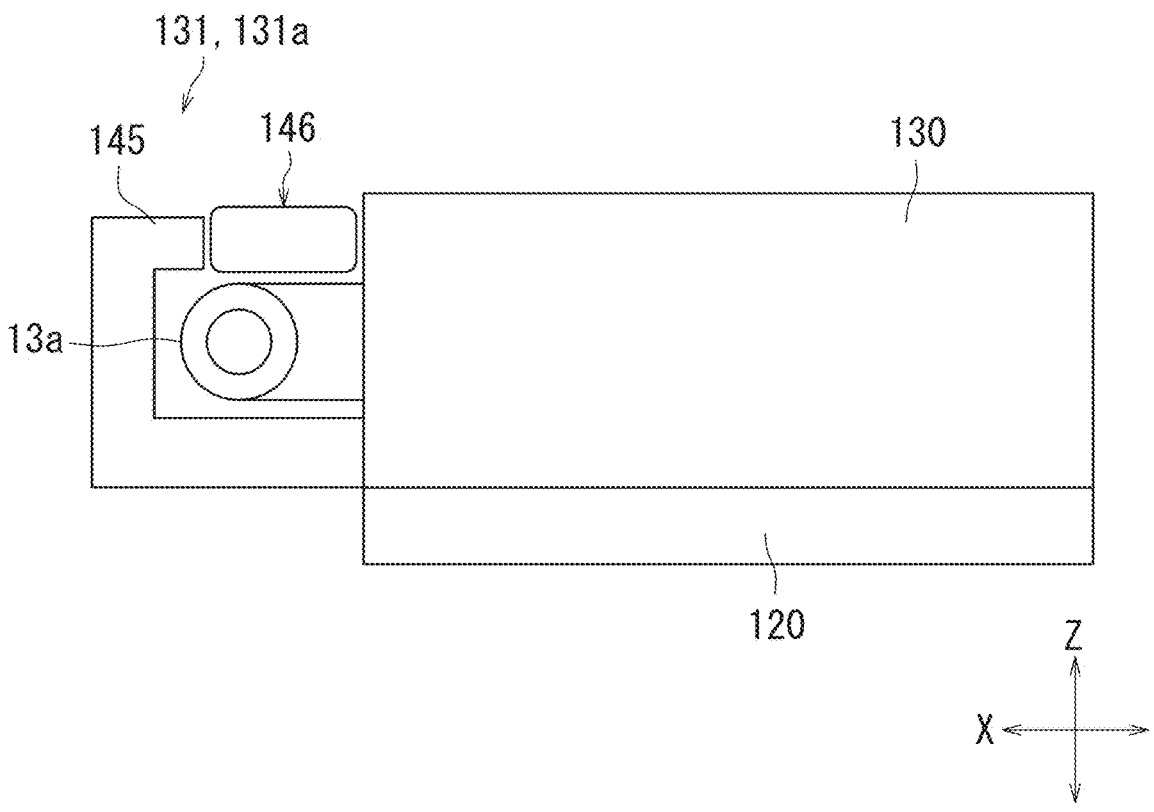
FIG. 9 is a sectional view of a first heat exchanger according to a fourth example embodiment of the present disclosure taken along the first direction and the third direction.

A cooling assembly A according to the fourth example embodiment of the present disclosure will be described with reference to FIG. 9. FIG. 9 is a sectional view of the first heat exchanger 110 according to the fourth example embodiment of the present disclosure taken along the first direction Z and the second direction X. The first fixing portion 131 according to the fourth example embodiment is different from that of the first example embodiment in that the first fixing portion 131 includes a hook portion 145 and an opening portion 146. Hereinafter, differences of the fourth example embodiment from the first example embodiment will be mainly described.

As shown in FIG. 9, the first fixing portion 131 includes the hook portion 145 having a substantially annular shape and the opening portion 146. The opening portion 146 is arranged on the one side in the first direction Z of the hook portion 145. The opening portion 146 may be provided on a part of an upper surface of the hook portion 145 or may be provided on the entire surface.

The first intermediate portion 13*a* is fixed to the hook portion 145. The first intermediate portion 13*a* is arranged in an internal space formed by the hook portion 145. As a result, it is possible to suppress the second pipe 2 from separating from the cover 130. Therefore, it is possible to suppress the first flow path pipe 10 from being caught by other members such as the first heat generating component. As a result, the first intermediate portion 13*a* can be easily fixed.

The example embodiments of the present disclosure have been described above with reference to the drawings. However, the above example embodiments are merely examples of the present disclosure, and the present disclosure is not limited to the above example embodiments, and can be implemented in various aspects without departing from the gist of the present disclosure. The drawings schematically show respective constituent elements mainly for easy understanding, and the thickness, length, number, and the like of the respective constituent elements that are shown may be different from the actual ones for convenience of the drawings. The material, shape, dimensions, and the like of the respective constituent elements described in the above example embodiments are merely examples and are not particularly limited, and various modifications can be made without substantially departing from the effects of the present disclosure. The configuration of the example embodiment may be appropriately modified without departing from the technical idea of the present disclosure. Example embodiments may also be implemented in combination as far as possible.

Features of the above-described example embodiments and the modifications thereof may be combined appropriately as long as no conflict arises.

While example embodiments of the present disclosure have been described above, it is to be understood that variations and modifications will be apparent to those skilled in the art without departing from the scope and spirit of the present disclosure. The scope of the present disclosure, therefore, is to be determined solely by the following claims.

What is claimed is:

1. A cooling assembly comprising:
a first heat exchanger that comes into contact with a first heat generating component;
a first flow path pipe that is connected to the first heat exchanger; and
a second flow path pipe that is connected to the first heat exchanger; wherein
the first flow path pipe includes a first intermediate portion between one end of the first flow path pipe connected to the first heat exchanger and another end of the first flow path pipe; and
the first heat exchanger includes a first fixing portion that fixes the first intermediate portion of the first flow path pipe;
the first heat exchanger includes:
a cold plate made of metal that comes into contact with the first heat generating component; and
a cover made of synthetic resin that is on one side of the cold plate in a first direction;
the cover includes:
the first fixing portion;
an inflow portion through which a refrigerant flows into;
an outflow portion through which the refrigerant flows out;
the one end of the first flow path pipe is connected to the inflow portion;
one end of the second flow path pipe is connected to the outflow portion;
the first fixing portion includes a first through-hole penetrating the cover along the first direction;
a portion of a substantially annular fixing portion is in the first through-hole; and
the first intermediate portion of the first flow path pipe is in an internal space defined by the substantially annular fixing portion.

2. The cooling assembly according to claim 1, wherein the first fixing portion further includes an inclined portion arranged on the one side of the first through-hole in the first direction; and
the inclined portion is inclined on a side of a second direction perpendicular or substantially perpendicular to the first direction.

3. The cooling assembly according to claim 1, wherein the cold plate includes a guide portion at least partially overlapping the first through-hole in the first direction; and
the guide portion is connected to an end on the other side of the first through-hole in the first direction.

4. The cooling assembly according to claim 3, wherein the cold plate includes the guide portion on the one side in the first direction.

5. The cooling assembly according to claim 1, wherein the first fixing portion includes a substantially annular hook portion and an opening portion on the one side of the hook portion in the first direction.

6. The cooling assembly according to claim 1, further comprising:
a second heat exchanger that comes into contact with a second heat generating component; and
a third heat exchanger that comes into contact with a third heat generating component; wherein
the first heat exchanger is between the second heat exchanger and the third heat exchanger in a second direction orthogonal to the first direction;
the second heat exchanger and the third heat exchanger are connected via a third flow path pipe; and
the third heat exchanger is connected to the other end of the first flow path pipe.

7. The cooling assembly according to claim 6, wherein the first flow path pipe is between the first heat exchanger and the third heat exchanger in the second direction.

8. The cooling assembly according to claim 1, further comprising:
a fourth heat exchanger that comes into contact with a fourth heat generating component; and
a fifth heat exchanger that comes into contact with a fifth heat generating component; wherein
the first flow path pipe includes:
a first pipe connected to the fourth heat exchanger;
a second pipe between the fourth heat exchanger and the fifth heat exchanger; and
a third pipe between the fifth heat exchanger and the first heat exchanger.

9. The cooling assembly according to claim 1, further comprising:
a sixth heat exchanger that comes into contact with a sixth heat generating component; and
a fourth flow path pipe that is connected to the sixth heat exchanger; wherein
the first flow path pipe further includes a second intermediate portion between the one end of the first flow path pipe and the other end of the first flow path pipe;
the sixth heat exchanger includes a second fixing portion that fixes the second intermediate portion of the first flow path pipe; and
the other end of the second flow path pipe is connected to the sixth heat exchanger.

* * * * *